United States Patent
Strobel et al.

(10) Patent No.: US 10,525,847 B2
(45) Date of Patent: Jan. 7, 2020

(54) POWER SWITCH, BATTERY SYSTEM AND METHOD FOR OPERATING A POWER SWITCH

(71) Applicant: Robert Bosch GmbH, Stuttgart (DE)

(72) Inventors: Jens Strobel, Freiberg am Neckar (DE); Oliver Krayl, Gerlingen (DE)

(73) Assignee: Robert Bosch GmbH, Stuttgart (DE)

( * ) Notice: Subject to any disclaimer, the term of this patent is extended or adjusted under 35 U.S.C. 154(b) by 149 days.

(21) Appl. No.: 15/515,208

(22) PCT Filed: Sep. 4, 2015

(86) PCT No.: PCT/EP2015/070243
§ 371 (c)(1),
(2) Date: Mar. 29, 2017

(87) PCT Pub. No.: WO2016/050448
PCT Pub. Date: Apr. 7, 2016

(65) Prior Publication Data
US 2017/0217327 A1    Aug. 3, 2017

(30) Foreign Application Priority Data
Oct. 2, 2014 (DE) .................. 10 2014 220 088

(51) Int. Cl.
*F16P 3/20*    (2006.01)
*B60L 58/10*   (2019.01)
(Continued)

(52) U.S. Cl.
CPC ........... *B60L 58/10* (2019.02); *H01M 2/1077* (2013.01); *H01M 10/0525* (2013.01);
(Continued)

(58) Field of Classification Search
CPC .......... H01M 2/1077; H01M 10/0525; H01M 2220/20; H02J 13/0003; H02J 7/0031; H02J 7/0026; H03K 17/6871; B60L 11/1851
See application file for complete search history.

(56) References Cited

U.S. PATENT DOCUMENTS

2012/0105043 A1* 5/2012 Wilson ............... H02M 3/158
                                                 323/304
2012/0223582 A1* 9/2012 Andrea ............... H02J 7/0016
                                                 307/80
(Continued)

FOREIGN PATENT DOCUMENTS

DE    102012023331    6/2014
EP    2642629        9/2013
(Continued)

OTHER PUBLICATIONS

International Search Report for Application No. PCT/EP2015/070243 dated Nov. 17, 2015 (English Translation, 2 pages).

*Primary Examiner* — Alfonso Perez Borroto
*Assistant Examiner* — Esayas G Yeshaw
(74) *Attorney, Agent, or Firm* — Michael Best & Friedrich LLP

(57) ABSTRACT

The invention relates to a power switch (100) for a battery system. The power switch (100) comprises: a first terminal (104); a second terminal (106); a control terminal (102) for receiving a control signal (108); a device (112) for identifying a power switching signal (114) and a communication signal (116) based on the control signal (108); a power section (118) comprising at least one switch (122) for switching an electrical connection between the first terminal (104) and the second terminal (106) based on the power switching signal (114); and a communication section (120) comprising at least one switch (124) for switching the
(Continued)

electrical connection between the first terminal (104) and the second terminal (106) based on the communication signal (116).

12 Claims, 4 Drawing Sheets

(51) Int. Cl.
   *H02J 13/00* (2006.01)
   *H02J 7/00* (2006.01)
   *H01M 2/10* (2006.01)
   *H01M 10/0525* (2010.01)
   *H03K 17/687* (2006.01)

(52) U.S. Cl.
   CPC .......... *H02J 7/0026* (2013.01); *H02J 7/0031* (2013.01); *H02J 13/0003* (2013.01); *H03K 17/6871* (2013.01); *H01M 2220/20* (2013.01)

(56) References Cited

U.S. PATENT DOCUMENTS

| | | | | |
|---|---|---|---|---|
| 2014/0009106 | A1* | 1/2014 | Andrea | H02H 9/002 |
| | | | | 320/107 |
| 2014/0161201 | A1* | 6/2014 | Yukizane | H04B 3/548 |
| | | | | 375/257 |
| 2015/0256070 | A1* | 9/2015 | Lee | H02P 27/08 |
| | | | | 323/283 |
| 2017/0077817 | A1* | 3/2017 | Houston | H02M 3/1582 |
| 2017/0126973 | A1* | 5/2017 | Skeoch | H04N 5/23241 |

FOREIGN PATENT DOCUMENTS

| | | |
|---|---|---|
| EP | 2725678 | 4/2014 |
| WO | 2012166946 | 12/2012 |

* cited by examiner

POWER SWITCH, BATTERY SYSTEM AND METHOD FOR OPERATING A POWER SWITCH

BACKGROUND OF THE INVENTION

The present invention relates to a power switch for a battery system, to a method for operating a power switch for a battery system and to a corresponding battery system.

Increased performance, energy efficiency, range and further improvements to safety are essential criteria in the development of future Li-ion battery systems for electric and hybrid vehicles. For monitoring system parameters and controlling battery condition, communication of data between battery cells or battery modules and the central battery control unit is necessary. The aim is to replace the DC isolated wiring hitherto used for data communication with data transfer by means of powerline communication.

EP 2642629 discloses a battery device, a battery management system and a battery management method.

SUMMARY OF THE INVENTION

Against this background, the approach presented here proposes an improved power switch for a battery system, along with an improved method for operating a power switch for a battery system and, lastly, a corresponding battery system that employs the power switch.

A power switch may be used, besides for switching high currents, to transmit a communication signal. In this case it is advantageous for the switching characteristics of the power switch to be optimized both with regard to switching high currents and with regard to transmitting the communication signal. This may advantageously be achieved by virtue of at least one switch of the power switch being used to switch high currents and at least one other switch of the power switch being used to transmit the communication signal.

A power switch for a battery system is proposed, wherein the power switch has the following features:

a first terminal, a second terminal and a control terminal for receiving a control signal;

a device for defining a power switching signal and a communication signal using the control signal;

a power section with at least one first switch for switching an electrical connection between the first terminal and the second terminal using the power switching signal; and communication section with at least one second switch for switching the electrical connection between the first terminal and the second terminal using the communication signal.

The power switch may, for example, be understood to be for an inverter, an inverter circuit or a battery system with one or more battery cells. The battery system may be used for a vehicle or motor vehicle. The vehicle may be, for example, a passenger car, a motorcycle, a commercial vehicle, a tractor unit, a bus, a utility machine, a warehouse vehicle or a rail vehicle. The power switch may have three terminals. The control terminal may be referred to as a gate terminal or gate electrode. The first terminal may be understood to be a drain electrode, a drain terminal, a collector or a collector terminal. The second terminal may be understood to be a source electrode, a source terminal, an emitter or an emitter terminal. The at least one first switch of the power section and the at least one second switch of the communication section may be understood to be semiconductor switches, for example transistors.

The defining device may be designed to define the power switching signal as a first signal component of the control signal and the communication signal as a second signal component of the control signal. The signal components may be defined by various frequency ranges of the control signal. For example, the first signal component may be assigned to a low frequency range of the control signal and the second signal component may be assigned to a high-frequency signal component of the control signal. For example, the signal components may simply be extracted from the control signal by a suitable filter device.

For this purpose, the defining device may have a high-pass filter and a low-pass filter. The defining device may be designed to filter the control signal using the low-pass filter in order to define the power switching signal with low-frequency signal components of the control signal. The defining device may be designed to filter the control signal using the high-pass filter in order to define the communication signal with high-frequency signal components of the control signal. A high-pass filter, also referred to as a low-cut filter, may be understood to be a filter designed to allow signal frequencies above a threshold frequency to pass substantially undiminished while damping lower frequencies—below the threshold frequency. A low-pass filter may be understood to be a filter designed to allow frequencies below a threshold frequency to pass substantially undiminished while damping higher frequencies—above the threshold frequency. Such filters are inexpensive to produce.

The power section may have a plurality of first switches that can be controlled using the power switching signal. In this manner a current to be switched via the power section can be distributed to multiple switches, thereby potentially preventing the power section from overheating.

The communication section may have a plurality of second switches that can be controlled using the communication signal. In this case a number of the first switches of the power section may be larger than a number of the second switches of the communication section. For example, the number of first switches may be larger than the number of second switches by at least a factor of 100.

The plurality of first switches of the power section and the plurality of second switches of the communication section may, in this case, be parallel-connected between the first terminal and the second terminal. The switches of the power switch may thus be arranged according to the switches of known power switches.

The power switch may be designed as a semiconductor component. Such an element is characterized by low manufacturing costs and compactness.

The power switch may be designed to use the at least one first switch and the at least one second switch to switch an electric current of more than 100 amps between the first terminal and the second terminal. In particular, the power switch may be designed to switch an electric current of at least 500 amps. Thus, a high-current switch may be produced that is able to switch e.g. an individual battery cell at a current of more than 100 A but a voltage of only 4 V. Consequently, the power switch is suitable for switching currents arising in a battery system of a vehicle.

Furthermore, a battery system is proposed with the following features:

at least one battery cell;

a power switch as mentioned above, wherein the first terminal or the second terminal of the power switch is coupled to a connection contact of the at least one battery cell; and a control device designed to deliver the control signal to the control terminal of the power switch.

A battery cell may be a Li-ion cell, for example. The battery system may also have a plurality of battery cells, which may be combined in one or more battery modules. In this case one battery module may be assigned one power switch.

A method is proposed for operating a power switch for a battery system, wherein the power switch has a first terminal, a second terminal, a control terminal, a power section with at least one first switch and a communication section with at least one second switch, wherein the method comprises the following steps:

defining a power switching signal and a communication signal using a control signal present on the control terminal;

using the power switching signal to switch an electrical connection between the first terminal and the second terminal using the at least one first switch of the power section; and using the communication signal to switch an electrical connection between the first terminal and the second terminal using the at least one second switch of the communication section.

The method can provide data communication superposed on a power signal. The method for switching a power switch may be used for applications in which it is advantageous to optimize the switching response of a power switch or transistor for two frequency ranges. This may be the case, for example, when combining power switching response with communication signal transmission in a power switch or transistor. As such, the described method may be used, for example, for simultaneous control and power switch designs in battery systems or high-voltage batteries in electric and hybrid vehicles, particularly in the case of inverter designs with power electronics integrated within a cell or module.

The approach presented here furthermore provides a control device designed to carry out, control and/or implement the steps of a variant of a method presented here in corresponding devices. This variant embodiment of the invention in the form of a control device can also quickly and efficiently accomplish the task on which the invention is based.

A control device may be understood to be, in this case, an electrical device that processes sensor signals and outputs control and/or data signals accordingly. The control device may have an interface, which may be hardware- and/or software-based. With a hardware-based design, the interfaces may be, for example, part of a system, referred to as an ASIC system, that comprises a wide range of functions of the control device. It is also possible, however, for the interfaces to be individual integrated circuits or to consist, at least in part, of discrete elements. With a software-based design, the interfaces may be software modules that are, for example, present on a microcontroller alongside other software modules.

Another advantage is a computer program product or computer program using program code that may be stored on a machine-readable medium or storage medium such as a semiconductor memory, hard disk memory or optical memory and is used to carry out, implement and/or control the steps of the method according to one of the embodiments described above, in particular when the program product or program is executed on a computer or device.

BRIEF DESCRIPTION OF THE DRAWINGS

The approach presented here will be described in more detail below by way of examples with reference to the appended drawings, in which.

DETAILED DESCRIPTION

In the following description of favorable exemplary embodiments of the present invention, the same or similar references will be used for the elements represented in the various figures and functioning in a similar manner, thereby avoiding a repeated description of these elements.

Figure 1:
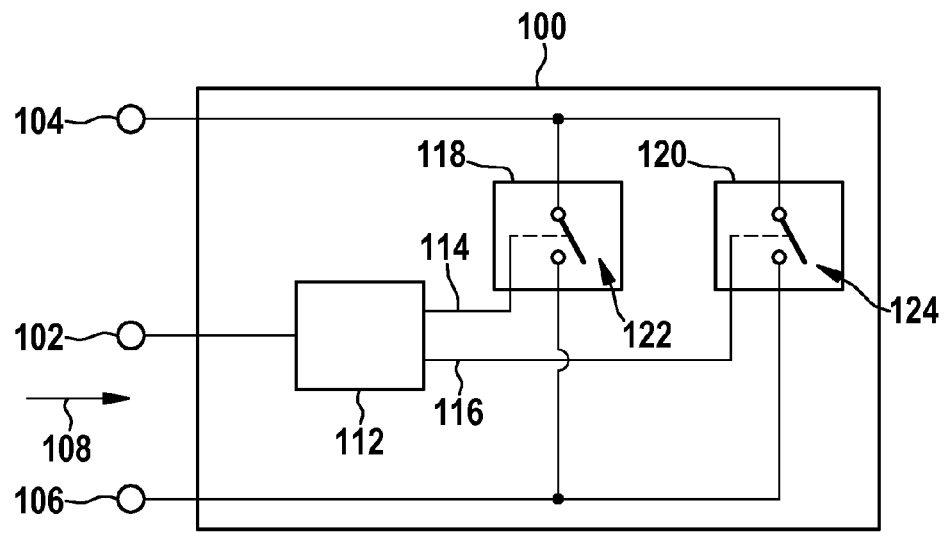
FIG. 1 shows a block diagram of a power switch according to one exemplary embodiment of the present invention.

FIG. 1 shows a block diagram of a power switch 100 according to one exemplary embodiment of the present invention. The power switch 100 has three terminals 102, 104, 106. A control terminal 102 is designed to receive a control signal 108. The power switch 100 is designed to switch or to make an electrical connection between the first terminal 104 and the second terminal 106 under the control of the control signal 108. The power switch 100 has a device 112 for defining a power switching signal 114 and a communication signal 116. The defining device 112 is designed to define the power switching signal 114 and the communication signal 116 using the control signal 108. The power switch 100 has a power section 118 and a communication section 120. The power section 118, comprising at least one first switch 122, is designed to make the electrical connection between the first terminal 104 and the second terminal 106 using the power switching signal 114. The communication section 120, comprising at least one second switch 124, is designed to make the electrical connection between the first terminal 104 and the second terminal 106 using the communication signal 116.

Figure 7:
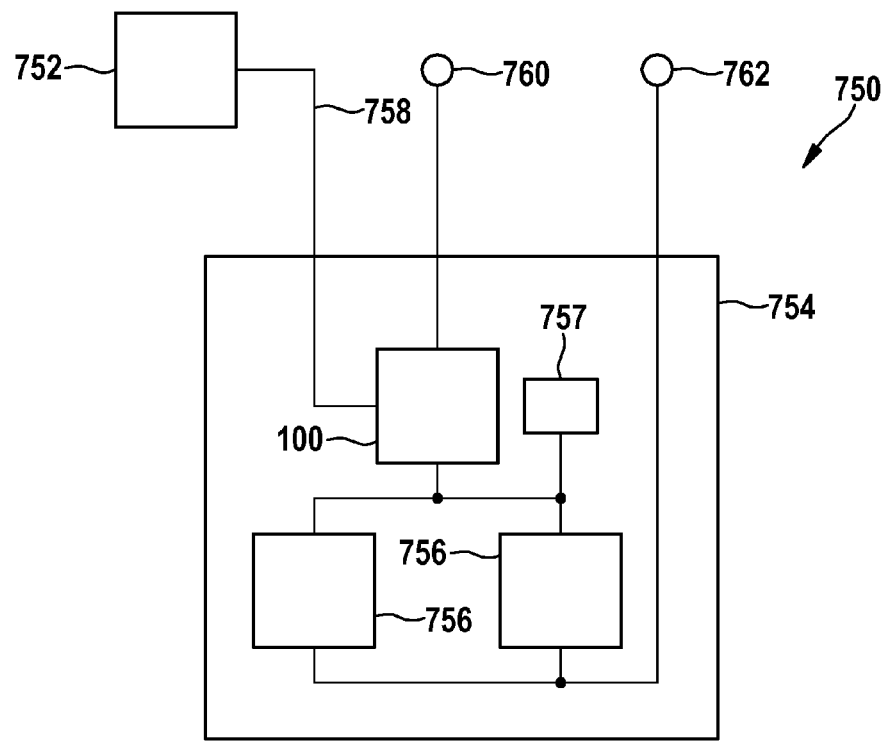
FIG. 7 shows a battery system according to one exemplary embodiment of the present invention.

In one exemplary embodiment, the power switch 100 is used for superposed data communication for a battery system, as shown in FIG. 7. The battery is employed, for example, in an electric vehicle or a hybrid vehicle.

In one exemplary embodiment, not shown in FIG. 1, the defining device 112 has a low-pass filter and a high-pass filter. The defining device 112 is, in one exemplary embodiment, designed to filter the control signal 108 using a low-pass filter, in order to define the power switching signal 114 with low-frequency signal components of the control signal 108. Furthermore, the defining device 112 is designed to filter the control signal 108 using a high-pass filter, in order to define the communication signal 116 with high-frequency signal components of the control signal 108.

In one exemplary embodiment, not shown, the power section 118 comprises a plurality of first switches 122 that can be controlled using the power switching signal 114. The first switches 122 are connected in parallel with one another between the first terminal 104 and the second terminal 106.

The communication section 120 may have a plurality of second switches 124 that can be controlled using the communication signal 116. In this case the first switches 124 are connected in parallel with one another between the first terminal 104 and the second terminal 106.

A number of the first switches 122 of the power section 118 is, in this case, larger than a number of the second switches 124 of the communication section 120.

Figure 2:
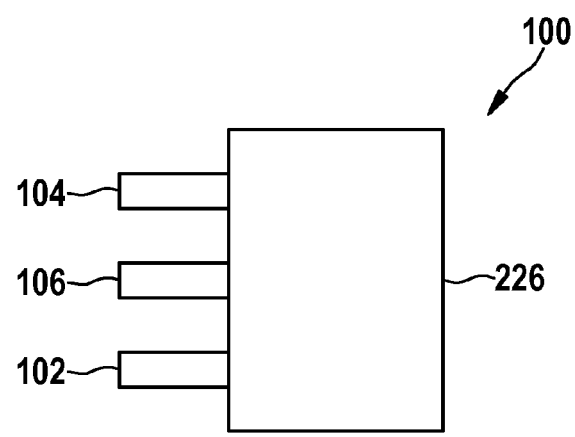
FIG. 2 shows a schematic representation of a power switch according to one exemplary embodiment of the present invention.

FIG. 2 shows a schematic representation of a power switch 100 according to one exemplary embodiment of the present invention. The power switch 100 has a control terminal 102, a first terminal 104 and a second terminal 106. A housing 226 encloses the devices of the power switch 100.

The control terminal 102 is also referred to as a gate terminal 102. The first terminal 104 is also referred to as a drain terminal 104, a collector 104 or a collector terminal 104. Additionally, the second terminal 106 is also referred as a source terminal 106, an emitter 106 or an emitter terminal 106.

The power switch 100 shown in FIG. 2 may be an exemplary embodiment of a power switch 100 as shown in FIG. 1, arranged in a housing. In one variant, the power switch 100 is a semiconductor component that is designed to switch electric current of more than 100 amps and voltage of more than 1000 volts. In this case the power switch provides data communication superposed on the power signal.

Figure 3:
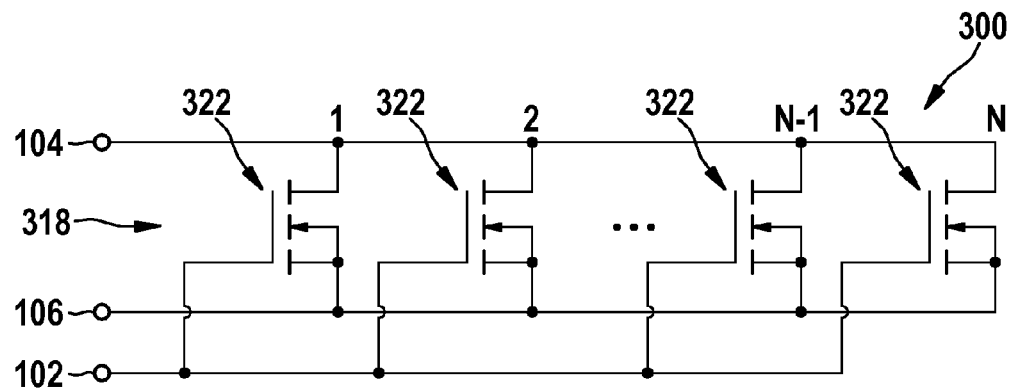
FIG. 3 shows a block diagram of a power switch for a battery system.

FIG. 3 shows a block diagram of a power switch 300 for a battery system. The power switch 300 has a control terminal 102, a first terminal 104, a second terminal 106 and four switches 322 or four individual switches 322.

The exemplary embodiment shown in FIG. 3 shows a typical arrangement of the individual switches 322, wherein a parallel arrangement of many individual switches 322 (typically transistors 322) is represented. The parallel connection of a number N of these individual switches 322 makes it possible for the power switch 300 to achieve a current-carrying capacity of approximately N times that of the individual switch 322.

For a power switch 300, also referred to as a transistor 300, the total current-carrying capacity $I_{ges}$ is approximately the sum of the individual current-carrying capacities $I_{einzel}$ of all N transistors 322:

$$I_{ges} N * T_{einzel} \quad (1)$$

The frequency response of a transistor 300 is substantially determined by the value of the input capacitance $C_G$ at the control input 102. In this case the time constant $T_G$ is calculated from the product of $C_G$ and the supply lead resistance $R_G$:

$$T_G = C_G * R_G \quad (2)$$

When the individual transistors 322 are connected in parallel to form an aggregate transistor 300, the respective individual input capacitances $C_{G\_einzel}$ are added together to give the total input capacitance $C_{G\_ges}$:

$$C_{G\_ges} = C_{G\_einzel} * N \quad (3)$$

Thus, according to equations (2) and (3), the total time constant $T_{G\_ges}$ is given by:

$$T_{G\_ges} = C_{G\_einzel} N * R_G \quad (4)$$

Due to the sum of the individual capacitances $C_{G\_einzel}$, $T_{G\_ges}$ is thus greater by a factor N in comparison with an individual transistor 322 and is thus also slower by this factor in terms of switching response.

Figure 4:
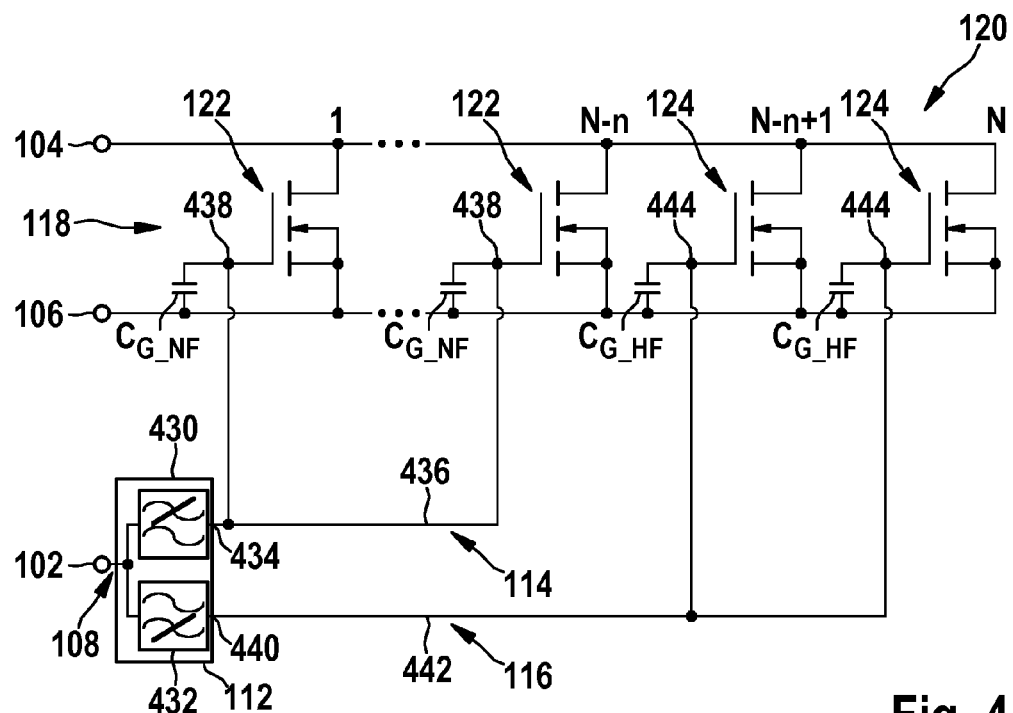
FIG. 4 shows a block diagram of a power switch for a battery system according to one exemplary embodiment of the present invention.

FIG. 4 shows a block diagram of a power switch 100 for a battery system according to one exemplary embodiment of the present invention. The power switch 100 may be an exemplary embodiment of a power switch 100 as shown in FIG. 1, wherein the power section 118 comprises a number N−n of first switches 122 and the communication section 120 comprises a number n of second switches 124. In FIG. 4, only two first switches 122 are shown for the power section 118 from a number N−n of first switches 122. The communication section 120 has two second switches 124. In one favorable exemplary embodiment, the number of first switches 122 of the power section 118 is larger than the number of second switches 124 of the communication section 120 by, for example, a factor of at least 100.

The power switch 100 additionally has a control terminal 102 for receiving a control signal 108. Furthermore, the power switch 100 has a first terminal 104 and a second terminal 106. The control terminal 102 is connected to a defining device 112. The defining device 112 comprises a low-pass filter 430 and a high-pass filter 432. The low-pass filter 430 is designed to define a power signal 114 using the control signal 108. The high-pass filter 432 is designed to define a communication signal 116 using the control signal 108. The first switches 122 of the power section 118 and the second switches 124 of the communication section 120 are parallel-connected between the first terminal 104 and the second terminal 106.

In one exemplary embodiment, the low-pass filter 430 defines the power signal 114 in response to the control signal 108. The high-pass filter 432 defines the communication signal 116 in response to the control signal 108.

One output 434 of the low-pass filter 430 is connected to a control terminal 438 of the first switches 122 of the power section 118 via a first signal line 436, or low-frequency signal line 436. One output 440 of the high-pass filter 432 is connected to a control terminal 444 of the second switches 124 of the communication section 120 via a second signal line 442, or high-frequency signal line 442. Between the control terminal 438 of the first switches 122 of the power section 118 and the second terminal 106, a respective capacitance $C_{G\_NF}$ is arranged and electrically connected to said terminals. Between the control terminal 444 of the second switches 124 of the communication section 120 and the second terminal 106, a respective capacitance $C_{G\_HF}$ is arranged and electrically connected to said terminals.

The power switch 100 shown in FIG. 4 is structurally similar to the power switch 300 shown in FIG. 3. Both the power switch 300 shown in FIG. 3 and the power switch 100 shown in FIG. 4 have a number N of switches 322 (FIG. 3) or a total number N of first switches 122 and second switches 124 (FIG. 4). In FIG. 3, the control signal 108 present on the control input 102 is routed directly to the switches 322, whereas in FIG. 4 a power signal 114 and a communication signal 116 are defined from the control signal 108 in the defining device 112, and the power signal 114 is routed to the first switches 122 of the power section 118 and the communication signal 116 is routed to the second switches 124 of the communication section 120.

From among the number N of first and second switches 122, 124, a markedly smaller number n of the second switches 124 is separately connected to the control terminal 102 in order to be used for the switching operations of the high-frequency signal component. This therefore results in the current-carrying capacity of the aggregate transistor $I_{ges}$ being divided into a low-frequency component $I_{NF}$, which is switched via a number N−n of first switches 122, and a high-frequency component $I_{HF}$, which is switched via a number n of second switches 124:

$$I_{ges} = I_{NF} + I_{HF} = I_{einzel} * (N-n) + I_{einzel} * n \quad (5)$$

Since n<<N, that is to say that the number n of second switches 124 is substantially smaller than the number N of first switches 122, is presupposed, then the current-carrying capacity $I_{NF}$ in the low-frequency range may be considered to be virtually unaffected, i.e. $I_{ges}$ corresponds approximately to $I_{NF}$ and the time constant $T_{G\_NF}$ of the transistor capacitances $C_{G\_NF}$ connected to the low-frequency signal line 436 also corresponds approximately to the time constant $T_G$.

$$T_{G\_NF}=C_{G\_NF}*(N-n) \quad (6)$$

In contrast thereto, for the second switches connected to the high-frequency signal line 442, a current-carrying capacity $I_{HF}$ is found:

$$I_{HF}=I_{einzel}*n \quad (7)$$

Thus, $I_{HF}<<I_{ges}$. However, since at high frequency only communication signals 116 whose power is markedly lower than on the low-frequency pathway are transmitted, this limitation presents no disadvantage.

Advantageously, the resulting time constant $T_{G\_HF}$ of the high-frequency signal pathway is given by:

$$T_{G\_HF}=C_{G\_einzel}*n*R_G \quad (8)$$

This time constant $T_{G\_HF}$ is smaller than that of the aggregate power switch $T_G$ shown in FIG. 3, that is to say power switch 300, by a factor N/n. Thus, a substantial decrease in the transient duration of switchover may be achieved and thus this power switch 100 is also suitable for the transmission of high-frequency signal components. In terms of control of the power switches 100, there is no difference in comparison with previous systems (no conversion costs), since furthermore only one control terminal 102 is present and the signal splitting of the superposed high and low frequencies of the control signal 108 into the power signal 114 and the communication signal 116 is carried out in the power semiconductor component 100 or in the defining device 112 inside the power switch 100. The combination of optimized switching response for both low-frequency power signals 114 and high-frequency data signals 116 represents a marked improvement in the prior art and may, for example, be used for traction batteries in electric vehicles for the simultaneous switching of inverter currents and communication signals to modules or battery cells.

Advantageously, dividing the switches 122, 124 into a power section 118 and a communication section 120 improves a temporal response of a power transistor 100 for the switching of high-frequency signals.

Figure 5:
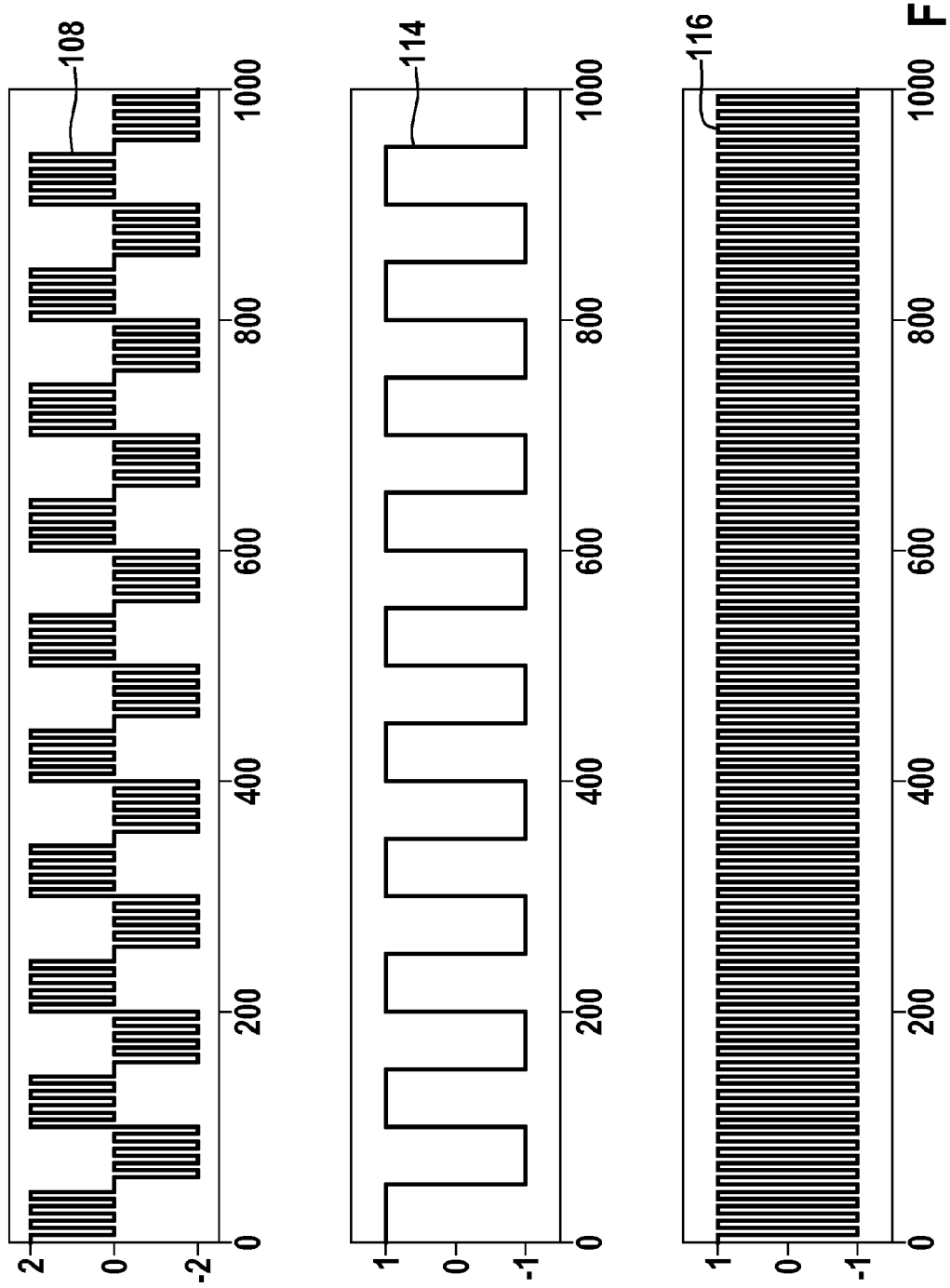
FIG. 5 shows a simplified representation of normalized signals of a power switch for a battery system.

FIG. 5 shows a simplified representation of normalized signals 108, 114, 116 of a power switch. In a stacked illustration, a control signal 108, a power signal 114 and a communication signal 116 are shown. The forementioned signals 108, 114, 116 are each shown in a Cartesian coordinate system with a normalized amplitude along the ordinate and in normalized time units along the abscissa. The control signal 108 may also be referred to as a gate control signal 108. The power signal 114 may also be referred to as a low-frequency power switching signal 114. The communication signal 116 may be understood to be a high-frequency communication signal 116. The signals 108, 114, 116 are alternating signals. In this case the control signal 108 has three different signal levels and the power signal 114 and the communication signal 116 have two different signal levels. The period duration of the signals has been chosen arbitrarily for the representation in FIG. 5. In this case the representation of the power signal 114 shows a low-frequency signal and the representation of the communication signal 116 shows a high-frequency signal. In the exemplary embodiment shown, the control signal 108 corresponds to the sum of the power signal 114 and the communication signal 116.

Figure 6:
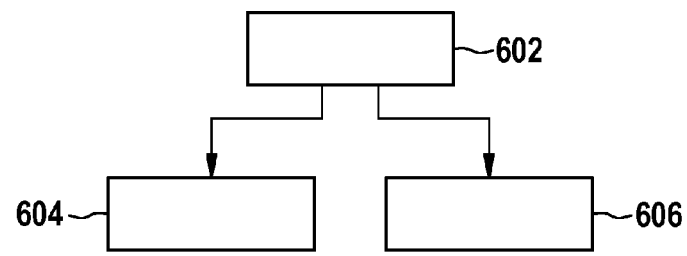
FIG. 6 shows a flowchart of a method for operating a power switch for a battery system according to one exemplary embodiment of the present invention.

FIG. 6 shows a flowchart of a method for operating a power switch for superposed data communication for a battery system according to one exemplary embodiment of the present invention. The power switch may, for example, be an exemplary embodiment of a power switch 100 as shown in FIG. 1 or FIG. 4. The method comprises a step 602 of defining a power switching signal and a communication signal using a control signal present on the control terminal of the power switch, a step 604 of using the power switching signal to switch an electrical connection between the first terminal and the second terminal using at least one first switch of the power section and a step 606 of using the communication signal to switch an electrical connection between the first terminal and the second terminal using at least one second switch of the communication section.

In one exemplary embodiment, in usage step 604, the power section of the power switch is controlled using the power switching signal, in order to switch an electrical connection between the first terminal and the second terminal, and in usage step 606, the communication section of the power switch is controlled using the communication signal, in order to switch the electrical connection between the first terminal and the second terminal. In this case, in step 604, the first switches are controlled in the power section and in step 606, the second switches are controlled in the communication section, in order to switch the electrical connection.

Control steps 604, 606 are typically carried out in parallel with one another, but can also be carried out sequentially.

In one optional exemplary embodiment, in defining step 602, the power switching signal and the communication signal are defined using a signal processing rule. In this case the at least one signal processing rule and the control signal are used to define the power switching signal with low-frequency signal components of the control signal and the communication signal with high-frequency signal components of the control signal.

One aspect of the method described in FIG. 6 is that an electrical switch, typically a power semiconductor, which is manufactured as a component, possesses both characteristics for switching high currents—of several hundreds of amps in the case of electric vehicles—and characteristics for switching high-frequency communication signals. Advantageously, battery cells or battery modules with integrated power electronics (inverters at module level or cell level) can exchange measurement data and control data between cells or modules and the central control unit without additional communication drivers.

FIG. 7 show a schematic representation of a battery system 750 according to one exemplary embodiment of the present invention. The battery system 750 may be a Li-ion battery 750. In the embodiment shown, the battery system 750 comprises a control device 752, a battery module 754, each with a power switch 100, two battery cells 756 and, for example, a sensor 757.

The control device 752 is connected to the control terminal 102 of the power switch 100 via a control line 758. The battery system 750 has a first terminal 760 and a second terminal 762. The first terminal 760 is connected to a first terminal of the power switch 100. The second terminal of the power switch 100 is connected to first terminals of the battery cells 756 and to a communication terminal of the sensor 757. Second terminals of the battery cells 756 are connected to the second terminal 762 of the battery system 750.

In one exemplary embodiment, the power switches 100, also referred to as power transistors 100, have an optimized switching response for superposed data communication for example on Li-ion batteries.

The power switches 100 represented in the exemplary embodiment shown in FIG. 7 are additionally used as communication drivers. It is advantageous, when using the described module- or cell-integrated power switches 100 as communication drivers, that the switching response (rise times, input capacitances, etc.) is adapted to both the communication frequencies and the frequencies of the power switches/inverter frequencies (typically 1 kHz to 10 kHz), which are typically markedly lower in relation to the communication frequencies (typically>>100 kHz).

The exemplary embodiments described and shown in the figures have been chosen only by way of example. Various exemplary embodiments may be combined with one another as a whole or with reference to individual features. It is also possible for an exemplary embodiment to have features from a further exemplary embodiment added thereto. Additionally, the method steps presented here may be repeated and carried out in an order other than that described.

If an exemplary embodiment comprises an "and/or" conjunction between a first feature and a second feature, this is intended to be read to mean that the exemplary embodiment has both the first feature and the second feature in accordance with one embodiment and has either just the first feature or just the second feature in accordance with a further embodiment.

The invention claimed is:

1. A power switch (100) for a battery system (750), the power switch (100) comprising:
    a first terminal (104);
    a second terminal (106);
    a control terminal (102) configured to receive a control signal (108);
    a device (112) for defining a power switching signal (114) and a communication signal (116) using the control signal (108);
    a power section (118) with at least one first switch (122) for switching an electrical connection between the first terminal (104) and the second terminal (106) using the power switching signal (114); and
    a communication section (120) with at least one second switch (124) for switching the electrical connection between the first terminal (104) and the second terminal (106) based on the communication signal (116).

2. The power switch (100) as claimed in claim 1, wherein the defining device (112) is configured to define the power switching signal (114) as a first signal component of the control signal (108) and the communication signal (116) as a second signal component of the control signal (108).

3. The power switch (100) as claimed in claim 1, wherein the defining device (112) has a low-pass filter (430) and a high-pass filter (432) and is configured to filter the control signal (108) using the low-pass filter (430) in order to define the power switching signal (114) with low-frequency signal components of the control signal (108) and to filter the control signal (108) using the high-pass filter (432) in order to define the communication signal (116) with high-frequency signal components of the control signal (108).

4. The power switch (100) as claimed in claim 1, wherein the power section (118) has a plurality of first switches (122) that are controlled using the power switching signal (114).

5. The power switch (100) as claimed in claim 1, wherein the communication section (120) has a plurality of second switches (124) that are controlled using the communication signal (116).

6. The power switch (100) as claimed in claim 4, wherein a number of the first switches (122) of the power section (118) is larger than a number of the second switches (124) of the communication section (120).

7. The power switch (100) as claimed in claim 1, wherein the at least one first switch (122) of the power section (118) and the at least one second switch (124) of the communication section (120) are parallel-connected between the first terminal (104) and the second terminal (106).

8. The power switch (100) as claimed in claim 1, wherein it is designed as a semiconductor component.

9. The power switch (100) as claimed in claim 1, wherein it is designed the power switch (100) is configured to use the at least one first switch (122) and the at least one second switch (124) to switch an electric current of more than 100 amps between the first terminal (104) and the second terminal (106).

10. A battery system (750) with the following features:
    at least one battery cell (756);
    a power switch (100) as claimed in claim 1, wherein the first terminal (104) of the power switch (100) is coupled to a connection contact of the at least one battery cell (765); and
    a control device (752) configured to deliver the control signal (108) to the control terminal (102) of the power switch (100).

11. A method for operating a power switch (100) for a battery system (750), wherein the power switch (100) has a first terminal (104), a second terminal (106), a control terminal (102), a power section (118) with at least one first switch (122) and a communication section (120) with at least one second switch (124), the method comprises:
    defining (602) a power switching signal (114) and a communication signal (116) using a control signal (108) present on the control terminal (102);
    using (604) the power switching signal (114) to switch an electrical connection between the first terminal (104) and the second terminal (106) using the at least one first switch (122) of the power section (118); and
    using (606) the communication signal (116) to switch the electrical connection between the first terminal (104) and the second terminal (106) using the at least one second switch (124) of the communication section (120).

12. A non-transitory computer readable medium including a program for carrying out all steps of the method as claimed in claim 11.

* * * * *